United States Patent [19]
Rinderle et al.

[11] Patent Number: 5,410,744
[45] Date of Patent: Apr. 25, 1995

[54] HF MIXER STAGE HAVING A COMMON BASE CIRCUIT

[75] Inventors: Heinz Rinderle; Hans Sapotta, both of Heilbronn, Germany

[73] Assignee: Temic Telefunken microelectronic GmbH, Hellbronn, Germany

[21] Appl. No.: 14,678

[22] Filed: Feb. 8, 1993

[30] Foreign Application Priority Data

Feb. 28, 1992 [DE] Germany ............... 42 06 164.4

[51] Int. Cl.[6] .............................................. H04B 1/16
[52] U.S. Cl. ..................................... 455/333; 455/323; 327/113
[58] Field of Search ............... 455/333, 323, 324, 325, 455/326, 318, 319; 307/529

[56] References Cited

U.S. PATENT DOCUMENTS

| | | |
|---|---|---|
| 4,080,573 | 3/1978 | Howell . |
| 4,310,810 | 1/1982 | Toyomura et al. . |
| 4,461,042 | 7/1984 | Tanabe et al. .................. 455/333 |
| 4,636,663 | 1/1987 | Jongepier et al. .............. 307/529 |
| 4,667,342 | 5/1987 | Lindenmeier et al. .......... 455/333 |
| 4,931,746 | 6/1990 | Trankle et al. ................ 455/333 |

FOREIGN PATENT DOCUMENTS

0073929  3/1983  European Pat. Off. .
159404   7/1991  Japan ............................. 455/333

Primary Examiner—Reinhard J. Eisenzopf
Assistant Examiner—Thanh C. Le
Attorney, Agent, or Firm—Spencer, Frank & Schneider

[57] ABSTRACT

An HF mixer stage having a common base circuit comprises an amplifier stage having two amplifier transistors, a switching stage with two transistor pairs each having two emitter-coupled switching transistors, and a switching circuit connected to the switching transistors; the switching transistors of a transistor pair are connected to the collector of the associated amplifier transistor, the bases of the switching transistors are subjected to a heterodyne signal. In accordance with the invention, the two amplifier transistors are of the opposite conductivity type, the emitters of the amplifier transistors are connected to the circuit input, and the two switching transistors of a transistor pair are of the same conductivity type as the associated amplifier transistors.

14 Claims, 2 Drawing Sheets

5,410,744

HF MIXER STAGE HAVING A COMMON BASE CIRCUIT

BACKGROUND OF THE INVENTION

Multiplicative mixer stages for frequency conversion are used for many applications in the HF range; in radios based on the superheterodyne receiver principle, for example, the received HF signal is converted into the intermediate frequency level (IF level). Multiplicative mixer stages of this type consist of an "active part" with a (differential) amplifier stage having two amplifier transistors, each of which is allocated two switching transistors, and switching means for correct-phase addition of the currents by the switching transistors. The amplifier transistors are either of the common emitter circuit type (Gilbert cell) or—for higher transit frequencies—of the common base circuit type. A drawback of circuit arrays of these types is their fairly low large-signal behavior-for example, the effect of this in radio receivers is a loss in dynamic for the entire signal processing sequence and represents a serious problem in view of growing transmitter density. In addition, known mixer stages having a common base circuit must always be operated symmetrically; however, if they are to process (asymmetrical) single-ended signals—for example in radio receivers the resonant circuit between the preselector stage and the mixer stage is unsymmetrical—additional baluns are necessary.

SUMMARY OF THE INVENTION

The object underlying the present invention is to provide an HF mixer stage in a common base circuit configuration that has a good large-signal behavior and in which asymmetrical feed of the input signal is possible and which mixer stage comprises an amplifier stage having first and second amplifier transistors, first and second switching stages connected to the first and second amplifier transistors, respectively, with each switching stage having two emitter-coupled switching transistors, and switching means connected to the emitter-coupled switching transistors of the first and second switching stages, with both of the emitter-coupled switching transistors of the first and second switching stages being connected to the collector of the first and second amplifier transistors, respectively, and with the bases of the emitter-coupled switching transistors being connected to receive a heterodyne signal from an oscillator.

This object is attained by a HF mixer stage having a common base circuit as described above, wherein the first and second amplifier transistors are of opposite conductivity type; wherein the emitters of the first and second amplifier transistors are connected to a circuit input; and wherein the two emitter-coupled switching transistors of the first and second switching stages have the same conductivity type as the first and second amplifier transistors, respectively.

Advantageous embodiments of the invention are described in detail below.

In the HF mixer stage in accordance with the invention, the amplifier stage of the "active part" is not designed as a differential amplifier-instead the difference is formed on the basis of the differing conductivity types of the two amplifier transistors. The divided-up input current is supplied by the amplifier transistors to the associated switching transistors of the switching stage; for this purpose, the collector of the respective amplifier transistor is connected to the emitters of the associated switching transistors. The outputs of the "active part" of the mixer stage are formed by the collectors of the switching transistors. To ensure correct multiplication of the input signal with the oscillator signal, the output currents of the active part of the mixer stage (the collector currents of the switching transistors) must be added with the correct phases using suitable switching means-for example using a transformer with 3 windings, an integrated circuit made of resistors and capacitors, or a current mirror circuit.

The circuit array in accordance with the invention combines several advantages:

The large-signal behavior can be significantly improved and hence the dynamic of the receiving part increased; this means that the linearity of the signal transmission is increased, which becomes evident in the intermodulation characteristics, for example—the "interception point" can be considerably increased and/or the current requirement reduced at the same time.

Since the circuit has only one input, unbalanced operation or asymmetrical feed of the input signal is possible, therefore, baluns can be dispensed with.

BRIEF DESCRIPTION OF THE DRAWINGS

The invention is described in the following on the basis of FIGS. 1 to 5, in which.

DESCRIPTION OF THE PREFERRED EMBODIMENTS

Figure 1:
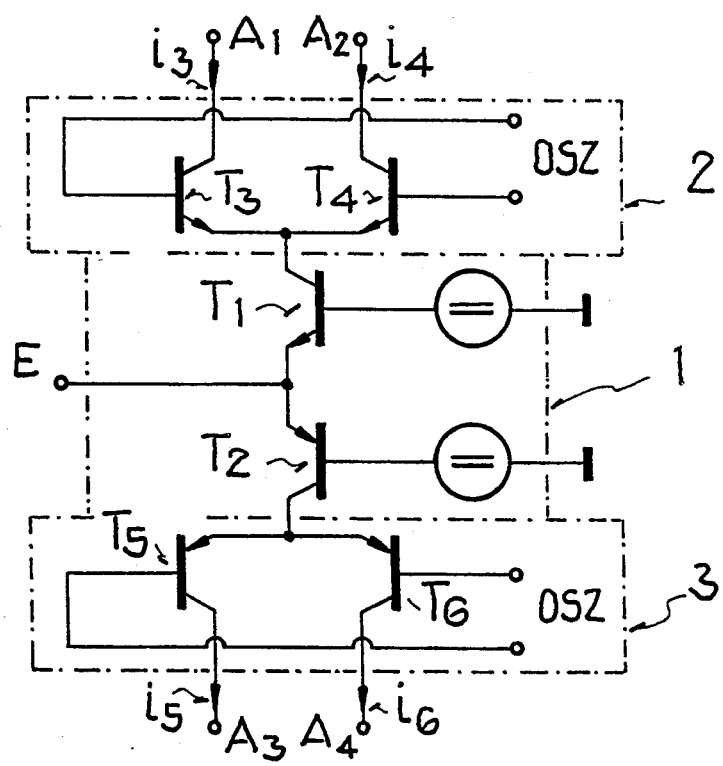
FIG. 1 shows a circuit array as an embodiment, according to the invention, of the HF mixer.

In accordance with FIG. 1, the amplifier stage 1 comprises the two emitter-coupled amplifier transistors $T_1$ and $T_2$, with the coupling point of the two emitters forming the circuit input E; the HF input signal is fed in at the latter. The operating points of the two amplifier transistors $T_1$ and $T_2$ can be preset in a wide variety of ways: for example (see FIG. 1) by biasing the bases of the amplifier transistors $T_1$ and $T_2$; or (to stabilize the operating point setting) by using two resistors, one of which connects the emitters of the two amplifier transistors $T_1$ and $T_2$ while the other connects to the base of the second amplifier transistor $T_2$ to a reference potential. The first switching stage 2 with the two emitter-coupled transistors $T_3$ and $T_4$ is connected to the collector of the first amplifier transistor $T_1$ and the second switching stage 3 with the two emitter-coupled transistors $T_5$ and $T_6$ is connected to the collector of the second amplifier transistor $T_2$. The bases of the switching transistors $T_3$–$T_6$ are supplied, in addition to suitable biasing signals, with heterodyne signals, for example the signal of an oscillator OSZ, the collectors of the switching transistors $T_3$, $T_4$, $T_5$, $T_6$ (to which flow the output currents $i_3$, $i_4$, $i_5$, $i_6$) form the summing outputs $A_1$, $A_2$, $A_3$ and $A_4$ of the "active part" of the mixer stage. The two amplifier transistors $T_1$ and $T_2$ are of the complementary conduction type, with—as shown in FIG. 1—the first amplifier transistor $T_1$ (connected to the positive pole of the circuit) being an NPN transistor and the second amplifier transistor $T_2$ (connected to the negative pole of the circuit) a PNP transistor. The switching transistors of the transistor pair of the first and second switching stages 2 and 3 are of the same conductivity type as the amplifier transistor $T_1$ and $T_2$ respectively with which they are associated; accordingly, the two switching transistors $T_3$ and $T_4$ of the first switching stage 2 are designed as NPN transistors while the switching transistors $T_5$ and $T_6$ of the second switching stage 3 are designed as PNP transistors.

Figure 2:
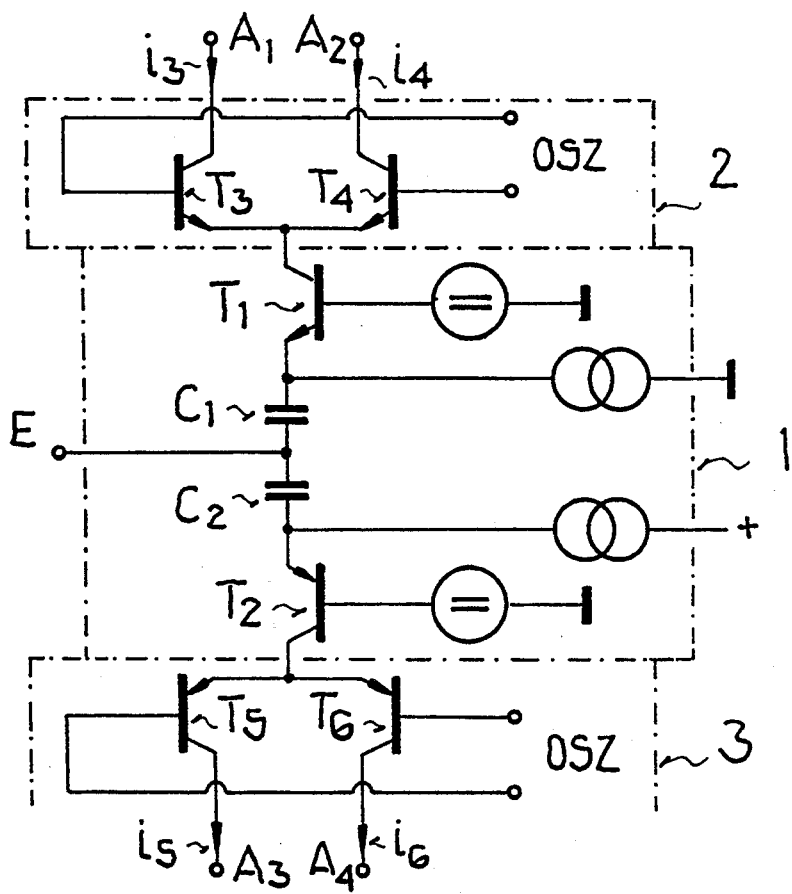
FIG. 2 shows a circuit array as a further embodiment, according to the invention, of the HF mixer for low operating voltages.

FIG. 2 shows a variant of the circuit array in FIG. 1 that can be used for low operating voltages; this is ensured by the fact that unlike the circuit array in FIG. 1, the transistors of different conductivity type as regards the current supply are not connected in series, but in parallel. An identical amount of DC current flows through both transistors. The two amplifier transistors $T_1$ and $T_2$ are not connected directly to the circuit input E (as in FIG. 1) but via a capacitor $C_1$ or $C_2$ respectively on account of their differing DC voltage potentials. Furthermore, a current source connected to the reference potential or operating voltage is connected to the emitter of each of the two amplifier transistors $T_1$ or $T_2$ in order to set the operating points.

Figure 3:
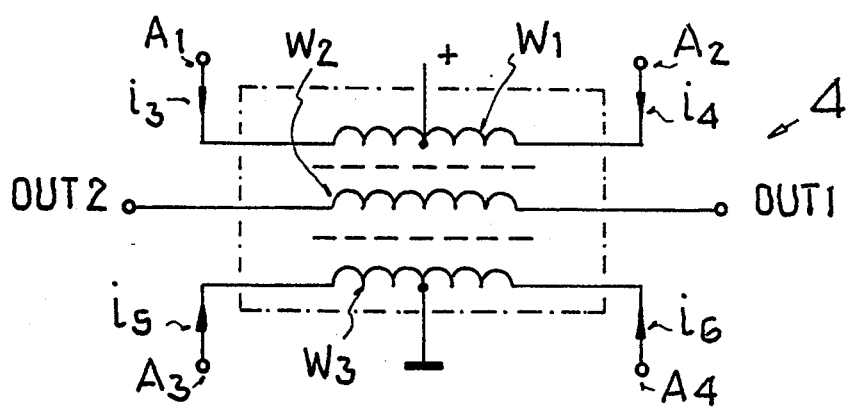
FIG. 3 shows an embodiment, according to the invention of the switching means for correct-phase addition of the output currents.

In order to achieve the required linearization in the transmission behavior, the output currents $i_3$–$i_6$ at the summing outputs $A_1$–$A_4$ of the "active part" of the mixer stage must be added with the correct phasing, or the input signal must be correctly multiplied with the signal of the oscillator OSZ. To ensure this, the circuit arrays of three embodiments are shown in FIGS. 3 to 5.

In Fig. three, a transformer 4 with 3 windings $W_1$, $W_2$ and $W_3$ is provided for that purpose: the first winding $W_1$, with and central tap connected to one pole of the operating voltage, is connected to the two summing outputs $A_1$ and $A_2$ of the mixer stage, the third winding $W_3$, with a central tap connected to the reference potential, i.e. the said pole of the operating voltage, is connected to the two summing outputs $A_3$ and $A_4$ of the mixer stage, and the two connections of the central winding $W_2$ form the two outputs of the mixer stage $OUT_1$ and $OUT_2$ respectively.

Figure 4:
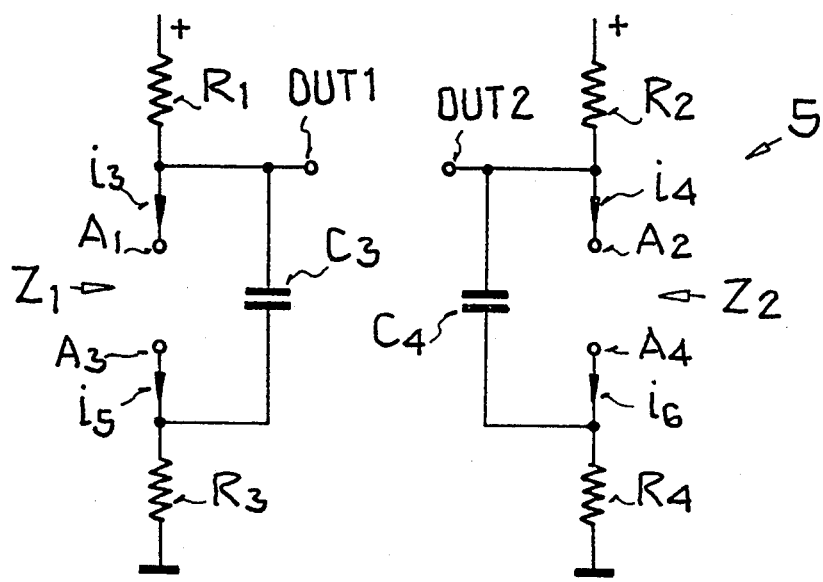
FIG. 4 shows another embodiment, according to the invention of the switching means for correct-phase addition of the output currents.

According to FIG. 4, an integrated circuit 5 of resistors $R_1$–$R_4$ and capacitors $C_3$ and $C_4$ is provided. The network forms two identical and symmetrically designed branches $Z_1$ and $Z_2$, with two resistors $R_1$, $R_3$ and $R_2$, $R_4$ being capacitively coupled in each branch $Z_1$ and $Z_2$ respectively via capacitors $C_3$ and $C_4$ respectively. One connection of the first resistors $R_1$ and $R_2$ is connected to the operating voltage, one connection of the second resistors $R_3$ and $R_4$ is connected to reference potential. The other two connections of the resistors $R_1$, $R_3$ and $R_2$, $R_4$ are connected both to one another via the capacitors $C_3$ and $C_4$ respectively and to one of the summing outputs $A_1$ to $A_4$. The two outputs $OUT_1$ and $OUT_2$ of the mixer stage are formed by the connection of the first resistors $R_1$ and $R_2$ connected to the capacitors $C_3$ and $C_4$, respectively.

Figure 5:
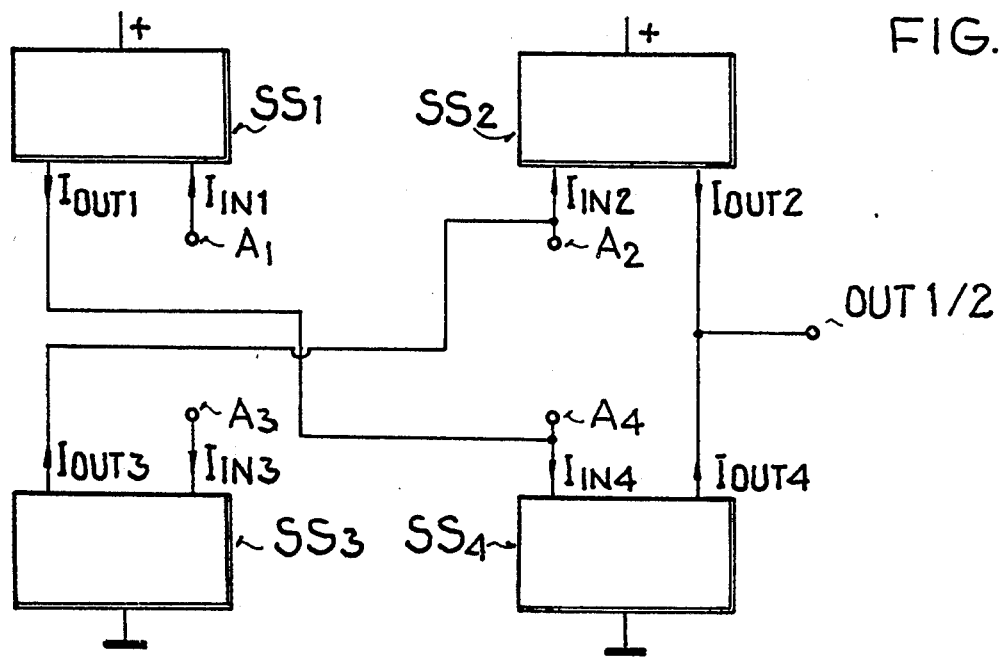
FIG. 5 shows a further embodiment, according to the invention of the switching means for correct-phase addition of the output currents.

According to FIG. 5, a current mirror circuit array 6 is provided made up of four current mirrors $SS_1$, $SS_2$, $SS_3$ and $SS_4$ comprising bipolar transistors and forming two pairs of current mirrors $SS_1$, $SS_2$ and $SS_3$, $SS_4$, with the current mirror pairs having a different conductivity type from one another. The two current mirrors $SS_1$, $SS_2$ of the first current mirror pair are connected to the operating voltage, the two current mirrors $SS_3$, $SS_4$ of the second current mirror pair are connected to the reference potential. The summing outputs $A_1$ and $A_2$ are connected to the inputs $I_{IN1}$ and $I_{IN2}$ respectively of the current mirrors $SS_1$ and $SS_2$ respectively of the first current mirror pair, and the summing outputs $A_3$ and $A_4$ are connected to the inputs $I_{IN3}$ and $I_{IN4}$ respectively of the current mirrors $SS_3$ and $SS_4$ respectively of the second current mirror pair. Furthermore, the inputs $I_{IN2}$ and $I_{IN4}$ of the second current mirrors $SS_2$ and $SS_4$ respectively of the two current mirror pairs are connected to the outputs $I_{OUT3}$ and $I_{OUT1}$ respectively of the first current mirrors $SS_3$ and SS respectively of the two current mirror pairs. The (single-phase) output $OUT_{\frac{1}{2}}$ of the mixer stage is formed by the two interconnected outputs $I_{OUT2}$, $I_{OUT4}$ of the second current mirrors $SS_2$, $SS_4$ of the two current mirror pairs.

With the circuit shown, the linearity of the transmission (for example evident in the intermodulation characteristics or interception point) can be significantly increased or the required current reduced; at the same time however, the noise characteristics are not worsened.

For this reason, the circuit is preferably used wherever a high linearity and/or a low current requirement is needed. Examples include cordless telephones, receiver circuits working on the direct mixing principle, phase comparators, high-linearity multiplier circuits etc.

What is claimed is:

1. An HF mixer stage of the common base circuit type, comprising an amplifier stage having first and second amplifier transistors, each connected in a common base circuit configuration, first and second switching stages connected to said first and second amplifier transistors, respectively, with each said switching stage having two emitter-coupled switching transistors and switching means connected to said emitter-coupled switching transistors of said first and second switching stages, with both of said emitter-coupled switching transistors of a respective one of said first and second switching stages being connected to the collector of said first and second amplifier transistors, respectively, and with the bases of said emitter-coupled switching transistors being connected to an input for a heterodyne signal; and wherein said first and second amplifier transistors are of opposite conductivity type, the emitters of said first and second amplifier transistors are connected to a common circuit input, and said two emitter-coupled switching transistors of a respective said first and second switching stage have the same conductivity type as said first and second amplifier transistors, respectively.

2. A mixer stage according to claim 1, wherein said emitters of said first and second amplifier transistors are directly connected to said circuit input, and wherein said first and second amplifier transistors are connected in series with respect to direct current.

3. A mixer stage according to claim 1, wherein said emitters of said first and second amplifier transistors are each connected to said circuit input via a further switching means, and wherein said first and second amplifier transistors are in parallel arrays with respect to direct current.

4. A mixer stage according to claim 3, wherein said further switching means includes a first and second capacitor disposed between the emitter of said first and second amplifier transistors, respectively, and said circuit input.

5. A mixer stage according to claim 1, wherein the collectors of said switching transistors form respective summing outputs.

6. A mixer stage according to claim 5, wherein said switching means are connected to said summing outputs, and further comprising at least one output of said mixer stage formed by said switching means.

7. A mixer stage according to claim 6, wherein said switching means are such that by correct-phase addition of the collector currents ($i_3$, $i_4$, $i_5$, $i_6$) of said switching transistors ($T_3$, $T_4$, $T_5$, $T_6$), the] an input signal applied at said circuit input is multiplied with the heterodyne signal from an oscillator and output at said at least one output of said mixer stage.

8. A mixer stage according to claim 7, wherein said switching means is a transformer with first, second and third windings.

9. A mixer stage according to claim 8, wherein said first winding of said transformer has a central tap connected to one pole of the operating voltage and is connected to respective said summing outputs of said switching transistors of said first switching stage, said second winding of said transformer has a central tap connected to the other pole of the operating voltage and is connected to respective said summing outputs of said switching transistors of said second switching stage, and each connection of said third winding of said transformer forms a respective output of said mixer stage.

10. A mixer stage according to claim 7, wherein said switching means is an integrated circuit of resistors and capacitors.

11. A mixer stage according to claim 10, wherein said integrated circuit comprises two identical and symmetrically designed branches, each branch having a capacitor and first and second resistors, wherein a first connection of each of said first resistors of said branches is connected to one pole of the operating voltage and a first connection of each of said second resistors of said branches is connected to the other pole of the operating voltage, wherein second connections of said first and second resistors of each of said branches are capacitively coupled via the respective said capacitor of the respective said branch, and wherein said second connection of each of said first resistors of said branches forms a respective output of said mixer stage.

12. A mixer stage according to claim 7, wherein said switching means is a current mirror circuit.

13. A mixer stage according to claim 12, wherein said current mirror circuit comprises four current mirrors of bipolar transistors forming identical first and second current mirror pairs, each having first and second current mirrors, and with each of said first and second current mirror pairs having a different conductivity type, wherein said first and second current mirrors of said first current mirror pair are connected to one pole of the operating voltage and said first and second current mirrors of said second current mirror pair are connected to the other pole of the operating voltage, wherein said summing outputs are connected to respective inputs of said four current mirrors, wherein said inputs of said second current mirrors of a current mirror pair are connected respectively to outputs of said first current mirror of the other current mirror pair, and wherein an output of said mixer stage is formed by interconnecting of the respective outputs of said second current mirrors of said first and second current mirror pairs.

14. A mixer stage according to claim 1, wherein said first amplifier transistor and said switching transistors of said first switching stage are NPN transistors, and wherein said second amplifier transistor and said switching transistors of said second switching stage are PNP transistors.

* * * * *